(12) United States Patent
Park et al.

(10) Patent No.: US 10,593,473 B2
(45) Date of Patent: Mar. 17, 2020

(54) MULTILAYER CERAMIC CAPACITOR AND BOARD HAVING THE SAME

(71) Applicant: SAMSUNG ELECTRO-MECHANICS CO., LTD., Suwon-si, Gyeonggi-do (KR)

(72) Inventors: Min Cheol Park, Suwon-si (KR); Kyo Kwang Lee, Suwon-si (KR); Young Ghyu Ahn, Suwon-si (KR); Hyun Tae Kim, Suwon-si (KR); Sang Soo Park, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/707,618

(22) Filed: Sep. 18, 2017

(65) Prior Publication Data
US 2018/0005757 A1    Jan. 4, 2018

Related U.S. Application Data

(63) Continuation of application No. 14/332,921, filed on Jul. 16, 2014, now abandoned.

(30) Foreign Application Priority Data

Jul. 17, 2013  (KR) .................. 10-2013-0084041
Jun. 30, 2014  (KR) .................. 10-2014-0080924

(51) Int. Cl.
*H01G 2/06* (2006.01)
*H05K 1/11* (2006.01)
(Continued)

(52) U.S. Cl.
CPC ............ *H01G 2/065* (2013.01); *H01G 4/005* (2013.01); *H01G 4/012* (2013.01); *H01G 4/232* (2013.01);
(Continued)

(58) Field of Classification Search
CPC ........ H01G 4/005; H01G 4/008; H01G 4/012; H01G 4/015; H01G 4/03; H01G 4/032;
(Continued)

(56) References Cited

U.S. PATENT DOCUMENTS 4,419,714 A    12/1983   Locke
4,831,494 A    5/1989    Arnold et al.
(Continued)

FOREIGN PATENT DOCUMENTS

CN    101241800 A    8/2008
CN    101656153 A    2/2010
(Continued)

OTHER PUBLICATIONS

U.S. Final Office Action dated May 16, 2017 issued in U.S. Appl. No. 14/332,921.
(Continued)

*Primary Examiner* — Steven T Sawyer
*Assistant Examiner* — Paresh H Paghadal
(74) *Attorney, Agent, or Firm* — Morgan, Lewis & Bockius LLP

(57) ABSTRACT

A multilayer ceramic capacitor may include: a ceramic body including a plurality of dielectric layers; first and second internal electrodes disposed in the ceramic body, the first internal electrode having first and second lead portions exposed to a first surface of the ceramic body in a width direction, and the second internal electrode having a third lead portion exposed to the first surface of the ceramic body in the width direction; first to third external electrodes disposed on the first surface of the ceramic body in the width direction to be connected to the first to third lead portions, respectively; and an insulation layer disposed on the first surface of the ceramic body in the width direction. Each of
(Continued)

the first and second lead portions may be spaced apart from the third lead portion by a predetermined distance.

10 Claims, 5 Drawing Sheets

(51) Int. Cl.
  *H01G 4/012* (2006.01)
  *H01G 4/232* (2006.01)
  *H01G 4/005* (2006.01)
  *H01G 4/30* (2006.01)
  *H05K 1/16* (2006.01)
  *H05K 3/34* (2006.01)

(52) U.S. Cl.
  CPC .............. *H01G 4/30* (2013.01); *H05K 1/111* (2013.01); *H05K 1/162* (2013.01); *H05K 3/3442* (2013.01); *H05K 2201/09227* (2013.01); *H05K 2201/10015* (2013.01); *Y02P 70/611* (2015.11)

(58) Field of Classification Search
  CPC ........ H01G 4/038; H01G 4/242; H01G 4/232; H01G 4/255; H01G 2/065; H05K 1/111; H05K 1/162; H05K 3/3442; H05K 2201/09227; H05K 2201/10015
  See application file for complete search history.

(56) References Cited

U.S. PATENT DOCUMENTS

| | | | |
|---|---|---|---|
| 7,463,474 | B2 | 12/2008 | Ritter et al. |
| 7,697,262 | B2 | 4/2010 | Ritter et al. |
| 7,920,370 | B2 | 4/2011 | Lee et al. |
| 8,098,478 | B2 * | 1/2012 | Niki .................. H01G 4/005 361/303 |
| 8,238,116 | B2 | 8/2012 | Eggerding et al. |
| 2004/0266087 | A1 | 12/2004 | Greier et al. |
| 2005/0286203 | A1 * | 12/2005 | Togashi .................. H01G 4/012 361/301.4 |
| 2007/0251066 | A1 * | 11/2007 | Kim .................... H01G 4/012 29/25.02 |
| 2008/0180877 | A1 | 7/2008 | Togashi et al. |
| 2008/0186652 | A1 | 8/2008 | Lee et al. |
| 2009/0002921 | A1 | 1/2009 | Ritter et al. |
| 2009/0073634 | A1 | 3/2009 | Lee et al. |
| 2011/0102969 | A1 | 5/2011 | Togashi |
| 2012/0223798 | A1 | 9/2012 | Wei |
| 2013/0005806 | A1 | 1/2013 | Beaudet et al. |
| 2013/0050897 | A1 | 2/2013 | Kim |
| 2013/0120900 | A1 | 5/2013 | Chung et al. |
| 2014/0160621 | A1 | 6/2014 | Yoon et al. |

FOREIGN PATENT DOCUMENTS

| | | | | |
|---|---|---|---|---|
| GB | 2464165 | A | | 4/2010 |
| JP | H03-96205 | A | | 4/1991 |
| JP | H11-312624 | A | | 11/1999 |
| JP | H10308322 | | * 7/2002 | ............. H01G 4/012 |
| JP | 2004-336041 | A | | 11/2004 |
| JP | 2006-086359 | A | | 3/2006 |
| JP | 2006-100646 | A | | 4/2006 |
| JP | 2006-100682 | A | | 4/2006 |
| JP | 2008-193055 | A | | 8/2008 |
| JP | 2009-026872 | A | | 2/2009 |
| JP | 2010-45339 | A | | 2/2010 |
| JP | 2010-177717 | A | | 8/2010 |
| JP | 2012-227491 | A | | 11/2012 |
| JP | 2013-55320 | A | | 3/2013 |
| JP | 2013-055321 | A | | 3/2013 |
| JP | 2013-106038 | A | | 5/2013 |
| JP | 2013-165218 | A | | 8/2013 |
| JP | 2014-160693 | A | | 9/2014 |

OTHER PUBLICATIONS

U.S. Non-final Office Action dated Oct. 28, 2016 issued in U.S. Appl. No. 14/332,921.
First Office Action Chinese Patent Application No. 201410337951.8 dated Aug. 3, 2016 with full English translation.
Japanese Office Action dated Feb. 9, 2016 in Japanese Patent Application No. 2014-144795 (with English translation).
U.S. Final Office Action dated May 5, 2016 issued in U.S. Appl. No. 14/332,921.
Korean Office Action dated Jan. 12, 2016, issued in corresponding Korean Patent Application No. 10-2014-0080924 (with English translation).
U.S. Non-final Office Action dated Dec. 31, 2015 issued in U.S. Appl. No. 14/332,921.
Notice of Office Action issued in counterpart Japanese Patent Application No. 2013-220074 dated Nov. 29, 2014 (with English translation).
Korean Office Action dated Feb. 13, 2018 issued in Korean Patent Application No. 10-2016-0109349 (with English translation).

* cited by examiner

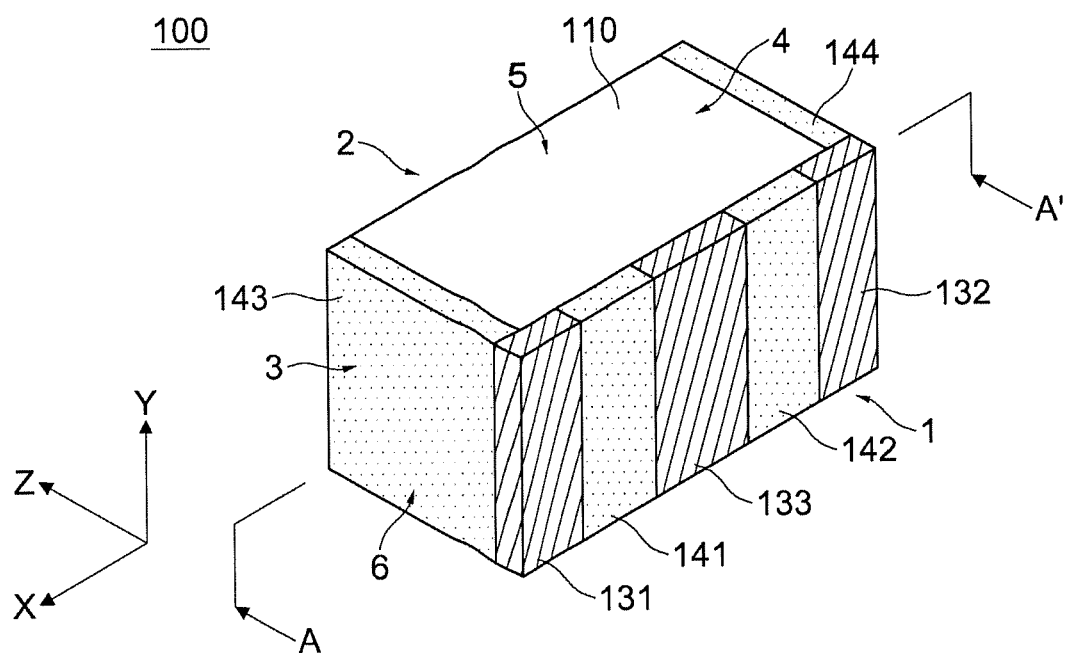
FIG. 1
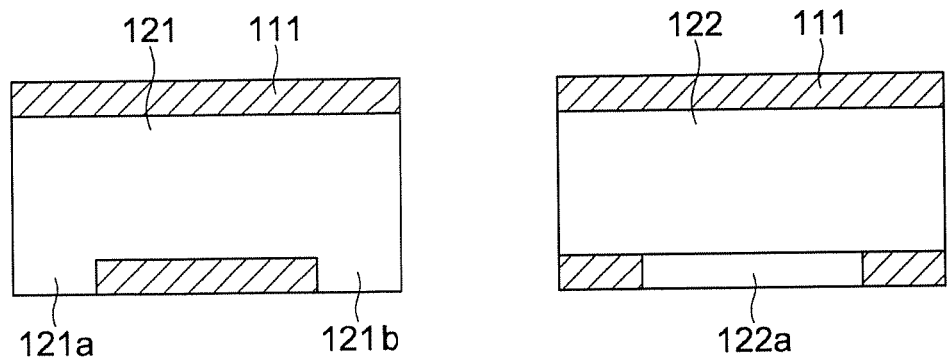
FIG. 2
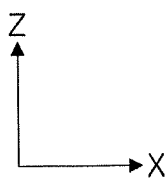

MULTILAYER CERAMIC CAPACITOR AND BOARD HAVING THE SAME

CROSS-REFERENCE TO RELATED APPLICATION

This application is a continuation of U.S. patent application Ser. No. 14/332,921, filed on Jul. 16, 2014, which claims the benefit of Korean Patent Application No. 10-2013-0084041 filed on Jul. 17, 2013, and Korean Patent Application No. 10-2014-0080924 filed on Jun. 30, 2014, with the Korean Intellectual Property Office, their disclosures of which are incorporated herein by reference.

BACKGROUND

The present disclosure relates to a multilayer ceramic capacitor and a circuit board structure having the multilayer ceramic capacitor.

Generally, electronic components using a ceramic material, such as a capacitor, an inductor, a piezoelectric element, a varistor, a thermistor, or the like, include a ceramic body made of a ceramic material, internal electrodes formed in the ceramic body, and external electrodes mounted on external surfaces of the ceramic body so as to be connected to the internal electrodes.

Among ceramic electronic components, a multilayer ceramic capacitor includes a plurality of stacked dielectric layers, internal electrodes disposed to face each other, having the dielectric layer interposed therebetween, and external electrodes electrically connected to the internal electrodes.

Multilayer ceramic capacitors have been widely used as components for mobile communications devices such as laptop computers, personal digital assistances (PDAs), mobile phones, and the like, due to advantages thereof such as a small size, high capacitance, and ease of mounting.

In accordance with the recent trend toward miniaturization and multifunctionalization of electronic devices, chip components also tend to be miniaturized and multifunctionalized. Therefore, demands have been made for multilayer ceramic capacitors having a small size and high capacitance.

In addition, a multilayer ceramic capacitor has been usefully used as a bypass capacitor disposed in a power supply circuit in a large scale integration (LSI) scheme. The multilayer ceramic capacitor serving as the bypass capacitor needs to effectively remove high frequency noise. This demand is further increasing in accordance with the trend in which electronic devices increasingly operate in a high frequency band. The multilayer ceramic capacitor used as the bypass capacitor may be electrically connected to a mounting pad on a circuit board through soldering, and the mounting pad may be connected to other external circuits through wiring patterns or conductive vias in the circuit board.

The multilayer ceramic capacitor includes equivalent series resistance (ESR) and equivalent series inductance (ESL) in addition to capacitance. These components of ESR and ESL deteriorate functions of the bypass capacitor. Especially, the ESL increases inductance of the capacitor in a high frequency band to thereby deteriorate the function of removing high frequency noise.

Meanwhile, in a case of a vertical multilayer capacitor, a low degree of ESL is required and, in order to achieve this, there has been proposed a method to form a margin region having no internal electrodes formed therein in a prefabricated ceramic laminate. However, the method may cause short-circuits.

Related Art Document

Korean Patent Laid-Open Publication No. 2010-0068056

SUMMARY

An exemplary embodiment in the present disclosure may provide a multilayer ceramic capacitor and a circuit board structure having the multilayer ceramic capacitor.

According to an exemplary embodiment in the present disclosure, a multilayer ceramic capacitor may include: a ceramic body including a plurality of dielectric layers; first and second internal electrodes disposed in the ceramic body, the first internal electrode having first and second lead portions spaced apart from each other by a predetermined distance and exposed to a first surface of the ceramic body in a width direction, and the second internal electrode having a third lead portion spaced apart from a third surface and a fourth surface connected to the first surface of the ceramic body by predetermined distances and exposed to the first surface of the ceramic body in the width direction; first to third external electrodes disposed on the first surface of the ceramic body in the width direction to be connected to the first to third lead portions, respectively; and an insulation layer disposed on the first surface of the ceramic body in the width direction, wherein each of the first and second lead portions is spaced apart from the third lead portion by a predetermined distance.

According to an exemplary embodiment in the present disclosure, a multilayer ceramic capacitor may include: a ceramic body including a plurality of dielectric layers; first and second internal electrodes disposed in the ceramic body, the first internal electrode having first to fourth lead portions spaced apart from one another by predetermined distances and exposed to first and second surfaces of the ceramic body in a width direction, and the second internal electrode having fifth and sixth lead portions exposed to the first and second surfaces of the ceramic body in the width direction and spaced apart from third and fourth surfaces of the ceramic body in a length direction by predetermined distances, the third and fourth surfaces being connected to the first and second surfaces; first to sixth external electrodes disposed on the first and second surfaces of the ceramic body in the width direction to be connected to the first to sixth lead portions, respectively; and insulation layers disposed on the first and second surfaces of the ceramic body in the width direction, wherein each of the first to fourth lead portions is spaced apart from the fifth lead portion or the sixth lead portion by a predetermined distance.

According to an exemplary embodiment in the present disclosure, a board having a multilayer ceramic capacitor may include: a printed circuit board having first to third electrode pads disposed thereon; and the multilayer ceramic capacitor as described above, mounted on the printed circuit board.

BRIEF DESCRIPTION OF DRAWINGS

The above and other aspects, features and other advantages of the present disclosure will be more clearly understood from the following detailed description taken in conjunction with the accompanying drawings, in which:

FIG. 1 is a perspective view schematically illustrating a multilayer ceramic capacitor according to an exemplary embodiment of the present disclosure;

FIG. 2 is a pair of cross-sectional views illustrating internal electrode structures of the multilayer ceramic capacitor shown in FIG. 1;

DETAILED DESCRIPTION

Figure 3:
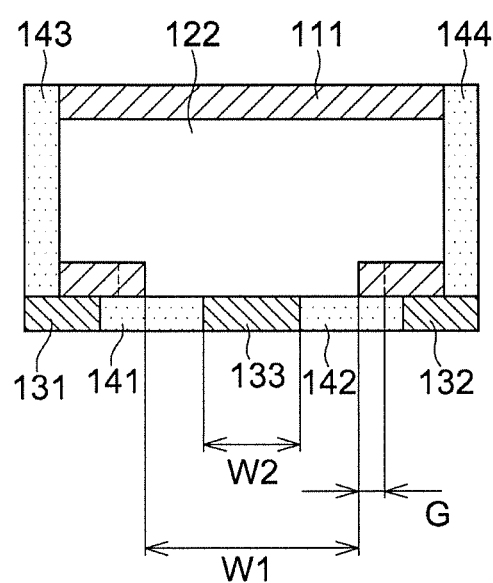
FIG. 3 is a cross-sectional view of the multilayer ceramic capacitor, taken along line A-A' of FIG. 1.

Exemplary embodiments of the present disclosure will now be described in detail with reference to the accompanying drawings.

The disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

In the drawings, the shapes and dimensions of elements maybe exaggerated for clarity, and the same reference numerals will be used throughout to designate the same or like elements.

Multilayer Ceramic Capacitor

FIG. 1 is a perspective view schematically illustrating a multilayer ceramic capacitor according to an exemplary embodiment of the present disclosure.

FIG. 2 is a pair of cross-sectional views illustrating internal electrode structures of the multilayer ceramic capacitor shown in FIG. 1.

FIG. 3 is a cross-sectional view of the multilayer ceramic capacitor, taken along line A-A' of FIG. 1.

The multilayer ceramic capacitor according to the exemplary embodiment may be a third-terminal vertically laminated or vertical multilayer capacitor. The term "vertically laminated" or "vertical multilayer" means that internal electrodes stacked within a capacitor are disposed to be perpendicular with respect to a mounting area surface of a circuit board, and the term "three-terminal" means that the capacitor has three terminals connected to the circuit board.

Referring to FIGS. 1 and 2, a multilayer ceramic capacitor 100 according to the exemplary embodiment may include a ceramic body 110, internal electrodes 121 and 122 formed in the ceramic body, and insulation layers 141 to 144 and external electrodes 131 to 133 that are respectively formed on surfaces of the ceramic body.

According to the exemplary embodiment, the ceramic body 110 may have first and second surfaces 1 and 2 opposing each other in a width direction, third and fourth surfaces 3 and 4 opposing each other in a length direction and connecting the first and second surfaces 1 and 2, and fifth and sixth surfaces 5 and 6 opposing each other in a thickness direction and connecting the first and second surfaces 1 and 2.

A shape of the ceramic body 110 may be, but is not specifically limited to, a hexahedral shape having the first to sixth surfaces as shown in the exemplary embodiment.

According to an exemplary embodiment of the present disclosure, the third and fourth surfaces 3 and 4 may oppose each other, and the fifth and sixth surfaces 5 and 6 may oppose each other.

According to an exemplary embodiment of the present disclosure, the first surface 1 of the ceramic body may be a mounting surface disposed on a mounting area of a circuit board.

According to an exemplary embodiment of the present disclosure, an X-direction may refer to a direction in which first to third external electrodes 131 to 133 are formed to be spaced apart by predetermined distances, a Y-direction may refer to a direction in which the internal electrodes are stacked with dielectric layers interposed therebetween, and a Z-direction may refer to a direction in which the internal electrodes are mounted on the circuit board.

According to an exemplary embodiment of the present disclosure, the ceramic body 110 may be formed by stacking a plurality of dielectric layers 111 therein. The plurality of dielectric layers 111 configuring the ceramic body 110 may be in a sintered state and be integrated so as not to confirm boundaries between the dielectric layers adjacent to each other.

A length of the ceramic body may be 1.0 mm or less, but is not limited thereto.

The dielectric layers 111 may be formed by sintering ceramic green sheets containing a ceramic powder, an organic solvent, and an organic binder. The ceramic powder may be a material having a high dielectric constant and may include, but is not limited to, a barium titanate ($BaTiO_3$) based material, a strontium titanate ($SrTiO_3$) based material, or the like.

According to an exemplary embodiment of the present disclosure, the first and second internal electrodes 121 and 122 may be formed in the ceramic body 110.

FIG. 2 is a pair of cross-sectional views illustrating the dielectric layer 111 configuring the ceramic body 110 and the first and second internal electrodes 121 and 122 disposed on the dielectric layer 111.

According to an exemplary embodiment of the present disclosure, the first and second internal electrodes 121 and 122 may be pairs of the first internal electrode 121 having a first polarity and the second internal electrode 122 having a second polarity and may be disposed in the Y-direction to face each other with each dielectric layer 111 interposed therebetween.

According to an exemplary embodiment of the present disclosure, the first and second internal electrodes 121 and 122 may be disposed to be perpendicular with respect to a mounting surface of the multilayer ceramic capacitor, that is, the first surface 1 of the ceramic body 110 in the width direction.

In the present disclosure, the first and second components may refer to components having opposite polarities, and the first and third components may refer to components having the same polarity.

According to an exemplary embodiment of the present disclosure, the first and second internal electrodes 121 and 122 maybe formed of a conductive paste containing a conductive metal.

The conductive metal may be, but is not limited to, nickel (Ni), copper (Cu), palladium (Pd), or an alloy thereof.

The internal electrodes maybe printed on ceramic green sheets configuring the dielectric layers, using a conductive paste through a printing method such as a screen printing method or a gravure printing method.

The ceramic green sheets having the internal electrodes printed thereon may be alternately stacked and sintered, thereby forming the ceramic body.

Referring to FIGS. 2 and 3, the first and second internal electrodes 121 and 122 may have lead portions 121a, 121b, and 122a so as to be connected to the external electrodes having different polarities. The lead portions 121a, 121b, and 122a may be exposed to the first surface 1 of the ceramic body in the width direction.

According to an exemplary embodiment of the present disclosure, the multilayer ceramic capacitor may be the vertically laminated or vertical multilayer capacitor. In the multilayer ceramic capacitor, the lead portions of the first internal electrode may be exposed to a surface of the ceramic body, to which the lead portion of the second internal electrode is exposed.

According to an exemplary embodiment of the present disclosure, the lead portion of the internal electrode may refer to a region of a conductive pattern, exposed to one surface of the ceramic body due to an increase in width W of the conductive pattern forming the internal electrode.

According to an exemplary embodiment of the present disclosure, the first internal electrode 121 may have two lead portions 121a and 121b.

The two lead portions 121a and 121b of the first internal electrode 121 may be disposed to be spaced apart from each other by a predetermined distance, and may be exposed to the first surface 1 of the ceramic body in the width direction.

According to an exemplary embodiment of the present disclosure, the first lead portion 121a of the first internal electrode 121 may be exposed to the first surface 1 of the ceramic body in the width direction and at the same time, may be exposed to the third surface 3 of the ceramic body in the length direction, and the second lead portion 121b of the first internal electrode 121 may be exposed to the first surface 1 of the ceramic body in the width direction and at the same time, may be exposed to the fourth surface 4 of the ceramic body in the length direction.

According to an exemplary embodiment of the present disclosure, the second internal electrode 122 may have a single lead portion 122a.

The third lead portion 122a of the second internal electrode 122 may be disposed to be spaced apart from the third and fourth surfaces 3 and 4 of the ceramic body in the length direction by predetermined distances, and may be exposed to the first surface 1 of the ceramic body.

The term "spaced apart by predetermined distances" means a state in which the third lead portion 122a of the second internal electrode 122 is not exposed to the third and fourth surfaces 3 and 4 of the ceramic body in the length direction to thereby be in an insulated state.

Each of the two lead portions 121a and 121b of the first internal electrode 121 may be spaced apart from the lead portion 122a of the second internal electrode 122 by a predetermined distance G.

The term "spaced apart by a predetermined distance G" means a state in which components are not overlapped with each other to thereby be insulated from each other, and hereinafter, the term "spaced apart by a predetermined distance G" is used to have the same concept as the state.

A more detailed description thereof will be provided below.

According to an exemplary embodiment of the present disclosure, end portions of the first and second internal electrodes 121 and 122 may be exposed to the third and fourth surfaces 3 and 4 of the ceramic body 110 in the length direction. The insulation layers may be formed on the third and fourth surfaces 3 and 4 of the ceramic body in the length direction and thus, short-circuits between the internal electrodes may be prevented.

According to an exemplary embodiment of the present disclosure, the first and second internal electrodes 121 and 122 may be formed so that a margin part may be formed only on the second surface 2 of the ceramic body 110, while the third and fourth surfaces 3 and 4 of the ceramic body 110 have no margin parts.

Generally, the first and second internal electrodes may overlap each other to form capacitance due to an overlap area thereof, and the lead portions thereof connected to the external electrodes having different polarities do not overlap each other.

Meanwhile, there has been an attempt at increasing capacitance by allowing the lead portions connected to the external electrodes having different polarities to partially overlap each other.

However, in this case, short-circuit defects may occur in a region in which the lead portions exposed outwardly overlap each other.

According to an exemplary embodiment of the present disclosure, in order to solve the defects, each of the two lead portions 121a and 121b of the first internal electrode 121 may be spaced apart from the lead portion 122a of the second internal electrode 122 by a predetermined distance.

When the predetermined distance by which each of the first and second lead portions 121a and 121b is spaced apart from the third lead portion 122a is denoted as G, $0 \leq G \leq 50$ μm may be satisfied.

By adjusting the predetermined distance G by which each of the first and second lead portions 121a and 121b is spaced apart from the third lead portion 122a to satisfy $0 \leq G \leq 50$ μm as described above, the short-circuit defects may be solved.

When the predetermined distance G by which each of the first and second lead portions 121a and 121b is spaced apart from the third lead portion 122a is 0 μm, the first and second lead portions 121a and 121b contact the third lead portion 122a but do not overlap with the third lead portion 122a, such that short-circuit defects do not occur. However, when the predetermined distance G is less than 0 μm (the case defined as having a negative (−) value), the first and second lead portions 121a and 121b may overlap with the third lead portion 122a, such that short circuit defects may occur during a chip cutting process.

On the other hand, when the predetermined distance G by which each of the first and second lead portions 121a and 121b is spaced apart from the third lead portion 122a exceeds 50 μm, a distance between the first and second internal electrodes to which external polarities are applied may be increased to extend a current loop, thereby increasing equivalent series inductance (ESL).

According to an exemplary embodiment of the present disclosure, when a width of the third lead portion 122a is denoted as W1 and a width of the third external electrode 133 connected to the third lead portion 122a is denoted as W2, $1.0 \leq W1/W2 \leq 2.0$ may be satisfied.

As described above, a ratio of the width W1 of the third lead portion 122a to the width W2 of the third external electrode 133 connected to the third lead portion 122a may be adjusted to satisfy $1.0 \leq W1/W2 \leq 2.0$, such that equivalent series inductance (ESL) may be lowered and a short-circuit may be prevented, thereby allowing for excellent reliability.

When the ratio W1/W2 of the width W1 of the third lead portion 122a to the width W2 of the third external electrode 133 connected to the third lead portion 122a is less than 1.0 or greater than 2.0, a short-circuit may occur and equivalent series inductance (ESL) may also be increased.

According to an exemplary embodiment of the present disclosure, the external electrodes may be disposed on a surface of the ceramic body so as to be connected to the internal electrodes.

More specifically, the first external electrode 131 may be disposed to be connected to the first lead portion 121a of the first internal electrode 121 exposed to the first surface 1 of the ceramic body 110, and the second external electrode 132 may be disposed to be connected to the second lead portion 121b of the first internal electrode 121 exposed to the first surface 1 of the ceramic body 110.

The first and second external electrodes 131 and 132 may be partially connected to the first and second lead portions 121a and 121b, but are not limited thereto.

In addition, the third external electrode 133 may be disposed to be connected to the third lead portion 122a of the second internal electrode 122 exposed to the first surface 1 of the ceramic body 110.

According to an exemplary embodiment of the present disclosure, the insulation layers 141 to 144 may be formed on the surfaces of the ceramic body 110.

More specifically, the first and second insulation layers 141 and 142 may be formed on the first surface 1 of the ceramic body in width direction, and the third and fourth insulation layers 143 and 144 may be formed on the third and fourth surfaces 3 and 4 thereof in the length direction, respectively.

The first insulation layer 141 may be formed between the first and third external electrodes 131 and 133 and the second insulation layer 142 may be formed between the second and third external electrodes 132 and 133, on the first surface 1 of the ceramic body 110 in the width direction.

The first and second insulation layers 141 and 142 may be formed to cover the lead portions 121a and 121b of the first internal electrode and the lead portion 122a of the second internal electrode that are exposed to the first surface.

The first and second insulation layers 141 and 142 may be formed to cover exposed areas of the lead portions 121a and 121b of the first internal electrode and the lead portion 122a of the second internal electrode.

According to an exemplary embodiment of the present disclosure, as shown in FIG. 3, the first and second insulation layers 141 and 142 maybe formed to completely cover the first surface 1 of the ceramic body, except for the first to third external electrodes 131 to 133.

In addition, although not shown, according to an exemplary embodiment of the present disclosure, the first and second insulation layers 141 and 142 maybe formed to be spaced apart from the first to third external electrodes 131 to 133 by predetermined distances.

According to an exemplary embodiment of the present disclosure, the third and fourth insulation layers 143 and 144 may be formed on the third and fourth surfaces 3 and 4 of the ceramic body 110, respectively, to which the end portions of the first and second internal electrodes 121 and 122 are exposed.

The third insulation layer 143 may be connected to a margin part of the dielectric layers 111, formed on the second surface 2 of the ceramic body in the width direction.

The fourth insulation layer 144 maybe connected to the margin part of the dielectric layers 111, formed on the second surface 2 of the ceramic body in the width direction.

According to an exemplary embodiment of the present disclosure, the insulation layers may be formed of the same material as or a similar material to that of the dielectric layers. When the insulation layers are connected to the dielectric layers, adhesion strength between the insulation layers and the ceramic body may be improved.

According to an exemplary embodiment of the present disclosure, the insulation layers 141 to 144 may be formed using a ceramic slurry. Formation positions and heights of the insulation layers may be adjusted by adjusting the amounts and shapes of the ceramic slurry. The insulation layers 141 to 144 may be formed by applying the ceramic slurry onto the ceramic body and then, sintering the ceramic slurry after forming the ceramic body through a sintering process.

Alternatively, the insulation layers may be formed by applying a ceramic slurry for forming the insulation layers to ceramic green sheets forming the ceramic body and then, sintering the ceramic slurry together with the ceramic green sheets.

A method of forming the ceramic slurry is not particularly limited. For example, the ceramic slurry may be formed through a method such as a spraying method, an application method using a roller, a coating method, an adhesion method, or the like.

According to an exemplary embodiment of the present disclosure, the insulation layers 141 to 144 may cover the lead portions 121a, 121b, and 122a that are exposed to one surface of the ceramic body, and the end portions of the first and second internal electrodes 121 and 122 to prevent a short-circuit between the internal electrodes, such that internal defects such as a deterioration in moisture resistance characteristics, and the like, may be prevented.

According to an exemplary embodiment of the present disclosure, the distance between the first and second internal electrodes to which external polarities are applied may be reduced to shorten the current loop, thereby decreasing ESL.

According to an exemplary embodiment of the present disclosure, the first and second insulation layers 141 and 142 may have a height lower than a height of the first to third external electrode 131 to 133.

The heights of the insulation layers 141 and 142 and the external electrodes 131 to 133 formed on the first surface may be measured.

According to an exemplary embodiment of the present disclosure, the first and second insulation layers 141 and 142 have a height lower than that of the first to third external electrodes 131 to 133, such that the multilayer ceramic capacitor may be more stably mounted on a circuit board.

In addition, although not shown, the first and second insulation layers 141 and 142 may have different heights.

Figure 4:
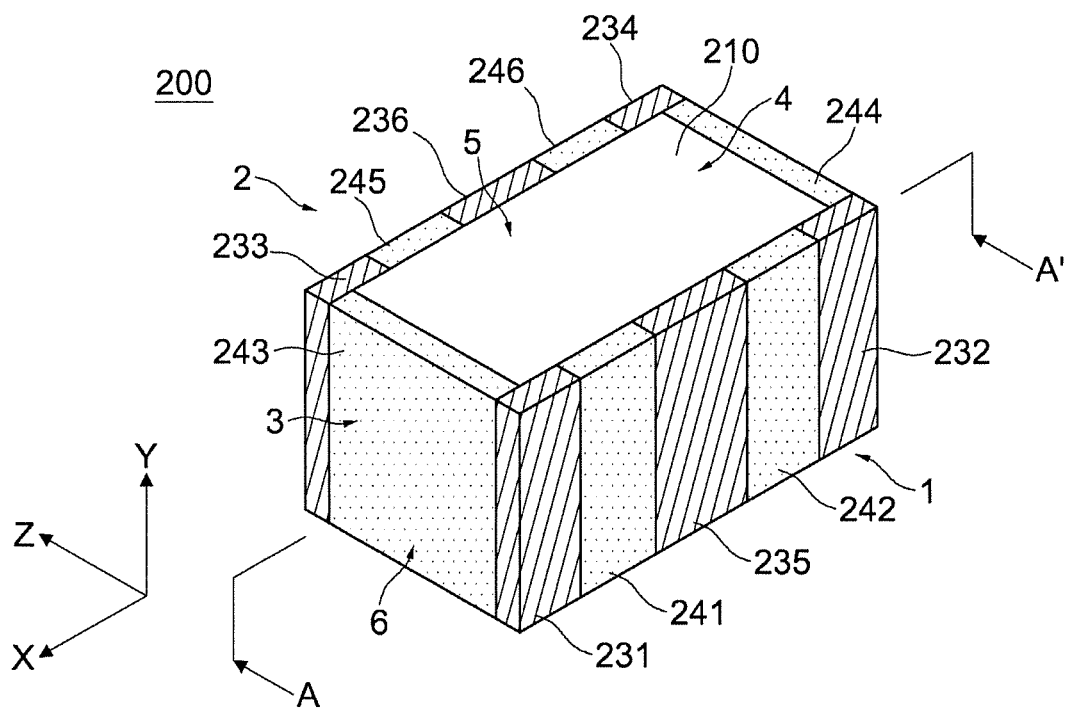
FIG. 4 is a perspective view illustrating a multilayer ceramic capacitor according to another exemplary embodiment of the present disclosure.

FIG. 4 is a perspective view illustrating a multilayer ceramic capacitor according to another exemplary embodiment of the present disclosure.

Figure 5:
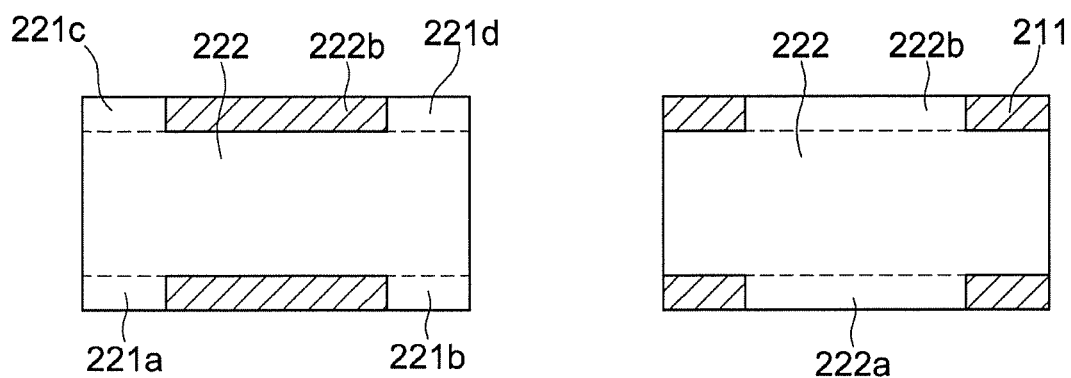
FIG. 5 is a pair of cross-sectional views illustrating internal electrode structures of the multilayer ceramic capacitor shown in FIG. 4.

FIG. 5 is a pair of cross-sectional views illustrating internal electrode structures of the multilayer ceramic capacitor shown in FIG. 4.

Figure 6:
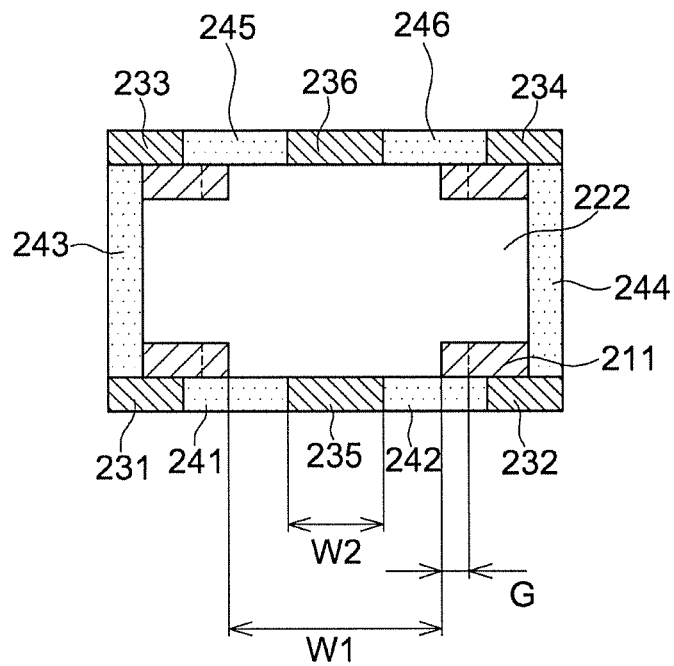
FIG. 6 is a cross-sectional view of the multilayer ceramic capacitor, taken along line A-A' of FIG. 4.

FIG. 6 is a cross-sectional view of the multilayer ceramic capacitor, taken along line A-A' of FIG. 4.

Hereinafter, descriptions will be made based on elements different from those of the above-mentioned exemplary embodiment, and detailed descriptions regarding the same elements will be omitted.

Referring to FIGS. 4 through 6, the multilayer ceramic capacitor according to another exemplary embodiment may be a six-terminal vertically laminated or vertical multilayer capacitor.

The term "six-terminal" means that the capacitor has six terminals connected to a circuit board.

A multilayer ceramic capacitor 200 according to another exemplary embodiment may include a ceramic body 210; internal electrodes 221 and 222 disposed in the ceramic body 210; and insulation layers 241 to 246 and external electrodes 231 to 236 formed on surfaces of the ceramic body 210.

FIG. 5 is a pair of cross-sectional views illustrating a dielectric layer 211 configuring the ceramic body 210 and the internal electrodes 221 and 222 formed on the dielectric layer 211.

According to an exemplary embodiment of the present disclosure, the first and second internal electrodes 221 and 222 may be pairs of the first internal electrode 221 having a first polarity and the second internal electrode 222 having a second polarity and may be disposed in the Y-direction to face each other with each dielectric layer 211 interposed therebetween.

According to an exemplary embodiment of the present disclosure, the first and second internal electrodes 221 and 222 may be disposed to be perpendicular with respect to a mounting surface of the multilayer ceramic capacitor.

According to the exemplary embodiment, the mounting surface of the multilayer ceramic capacitor may be a first surface 1 or a second surface 2 opposing the first surface 1 of the ceramic body.

Referring to FIGS. 5 and 6, the first and second internal electrodes 221 and 222 may have lead portions 221a, 221b, 221c, 221d, 222a, and 222b so as to be connected to the external electrodes having different polarities.

According to an exemplary embodiment of the present disclosure, the multilayer ceramic capacitor may be the vertically laminated or vertical multilayer capacitor. In the multilayer ceramic capacitor, the lead portions of the first internal electrode may be exposed to surfaces of the ceramic body, to which the lead portions of the second internal electrode are exposed.

According to an exemplary embodiment of the present disclosure, the first internal electrode 221 may have four lead portions 221a to 221d.

According to an exemplary embodiment of the present disclosure, two lead portions 221a and 221b of the first internal electrode 221 may be formed to be spaced apart from each other by a predetermined distance and may be exposed to the first surface 1 of the ceramic body in the width direction, and the remaining two lead portions 221c and 221d of the first internal electrode 221 may be formed to be spaced apart from each other by a predetermined distance and may be exposed to the second surface 2 of the ceramic body, opposing the first surface 1 thereof in the width direction.

According to an exemplary embodiment of the present disclosure, the first lead portion 221a of the first internal electrode 221 may be exposed to the first surface 1 of the ceramic body 210 in the width direction and at the same time, may be exposed to the third surface 3 of the ceramic body in the length direction, and the second lead portion 221b of the first internal electrode 221 may be exposed to the first surface 1 of the ceramic body 210 in the width direction and at the same time, may be exposed to the fourth surface 4 of the ceramic body 210 in the length direction.

Similarly, the third lead portion 221c of the first internal electrode 221 may be exposed to the second surface 2 of the ceramic body 210 in the width direction and at the same time, may be exposed to the third surface 3 of the ceramic body 210 in the length direction, and the fourth lead portion 221d of the first internal electrode 221 may be exposed to the second surface 2 of the ceramic body 210 in the width direction and at the same time, may be exposed to the fourth surface 4 of the ceramic body 210 in the length direction.

According to an exemplary embodiment of the present disclosure, the second internal electrode 222 may have two lead portions 222a and 222b.

According to an exemplary embodiment of the present disclosure, the fifth lead portion 222a of the second internal electrode 222 may be formed to be spaced apart from the third and fourth surfaces 3 and 4 of the ceramic body in the length direction by predetermined distances and may be exposed to the first surface 1 of the ceramic body 210 in the width direction, and the sixth lead portion 222b of the second internal electrode 222 may be formed to be spaced apart from the third and fourth surfaces 3 and 4 of the ceramic body 210 in the length direction by predetermined distances and may be exposed to the second surface 2 of the ceramic body 210, opposing the first surface 1 thereof in the width direction.

Each of the first and second lead portions 221a and 221b of the first internal electrode 221 may be spaced apart from the fifth lead portion 222a of the second internal electrode 222 by a predetermined distance G.

Similarly, each of the third and fourth lead portions 221c and 221d of the first internal electrode 221 may be spaced apart from the sixth lead portion 222b of the second internal electrode 222 by a predetermined distance G.

According to an exemplary embodiment of the present disclosure, end portions of the first and second internal electrodes 221 and 222 may be exposed to the third and fourth surfaces 3 and 4 of the ceramic body 210 in the length direction.

The insulation layers may be formed on the third and fourth surfaces 3 and 4 of the ceramic body 210 in the length direction and thus, short-circuits between the first and second internal electrodes may be prevented.

Referring to FIG. 6, the external electrodes may be formed on surfaces of the ceramic body so as to be connected to the internal electrodes.

More specifically, the first and second external electrodes 231 and 233 may be formed to be connected to the first and second lead portions 221a and 221b of the first internal electrode 221 exposed to the first surface 1 of the ceramic body 210 in the width direction, respectively.

In addition, the fifth external electrode 235 may be formed to be connected to the fifth lead portion 222a of the second internal electrode 222 exposed to the first surface 1 of the ceramic body 210 in the width direction.

Similarly, the third and fourth external electrodes 233 and 234 may be formed to be connected to the third and fourth lead. portions 221c and 221d of the first internal electrode exposed to the second surface 2 of the ceramic body in the width direction, respectively, and the sixth external electrode 236 may be formed to be connected to the sixth lead portion 222b of the second internal electrode exposed to the second surface of the ceramic body.

In a similar manner to those of the foregoing exemplary embodiment, the first to fourth external electrodes 231, 232, 233, and 234 may be partially connected to the first to fourth lead portions 221a, 221b, 221c and 221d of the first internal electrode, respectively.

According to an exemplary embodiment of the present disclosure, the insulation layers 241 to 246 may be formed on the surfaces of the ceramic body.

More specifically, the first and second insulation layers 241 and 242 may be formed on the first surface of the ceramic body in the width direction, the third and fourth insulation layers 243 and 244 may be formed on the third and fourth surfaces of the ceramic body in the length direction, respectively, and the fifth and sixth insulation layers 245 and 246 may be formed on the second surface of the ceramic body in the width direction.

The first insulation layer 241 may be formed between the first and fifth external electrodes 231 and 235 and the second insulation layer 242 may be formed between the second and fifth external electrodes 232 and 235, on the first surface of the ceramic body in the width direction.

The first and second insulation layers 241 and 242 may be formed to cover the lead portions 221a and 221b of the first internal electrode and the lead portion 222a of the second internal electrode that are exposed to the first surface. The first and second insulation layers 241 and 242 may be formed to cover exposed areas of the lead portions of the first internal electrode and the lead portion of the second internal electrode.

Additionally, according to an exemplary embodiment of the present disclosure, the first and second insulation layers 241 and 242 may be formed to completely cover the first surface of the ceramic body, except for the first, second, and fifth external electrodes 231, 232, and 235.

In addition, although not shown, according to an exemplary embodiment of the present disclosure, the first and second insulation layers 241 and 242 may be formed to be spaced apart from the first, second, and fifth external electrodes 231, 232, and 235 by predetermined distances.

In addition, the fifth and sixth insulation layers 245 and 246 may be formed on the second surface of the ceramic body in a similar manner to that of the first and second insulation layers 241 and 242.

According to an exemplary embodiment of the present disclosure, the third and fourth insulation layers 243 and 244 may be formed on the third and fourth surfaces of the ceramic body, respectively, to which the end portions of the first and second internal electrodes 221 and 222 are exposed.

According to an exemplary embodiment of the present disclosure, the insulation layers may be formed of the same material as or a similar material to that of the dielectric layers. When the insulation layers are connected to the dielectric layers, adhesion strength between the insulation layers and the ceramic body may be improved.

In addition, the insulation layers may cover the end portions and the lead portions of the first and second internal electrodes that are exposed to the surfaces of the ceramic body to prevent a short-circuit between the internal electrodes, such that internal defects such as a deterioration in moisture resistance characteristics and the like, may be prevented.

According to the exemplary embodiment, the distance between the first and second internal electrodes to which external polarities are applied may be reduced to shorten a current loop, thereby decreasing ESL.

In addition, although now shown, the first or second internal electrode may include two or more lead portions, and the lead portions formed in the first or second internal electrode may be exposed to the same common surface or different surfaces of the ceramic body. The number, positions, and the like, of the lead portions formed in the internal electrode may be variously modified by those skilled in the art.

Figure 7:
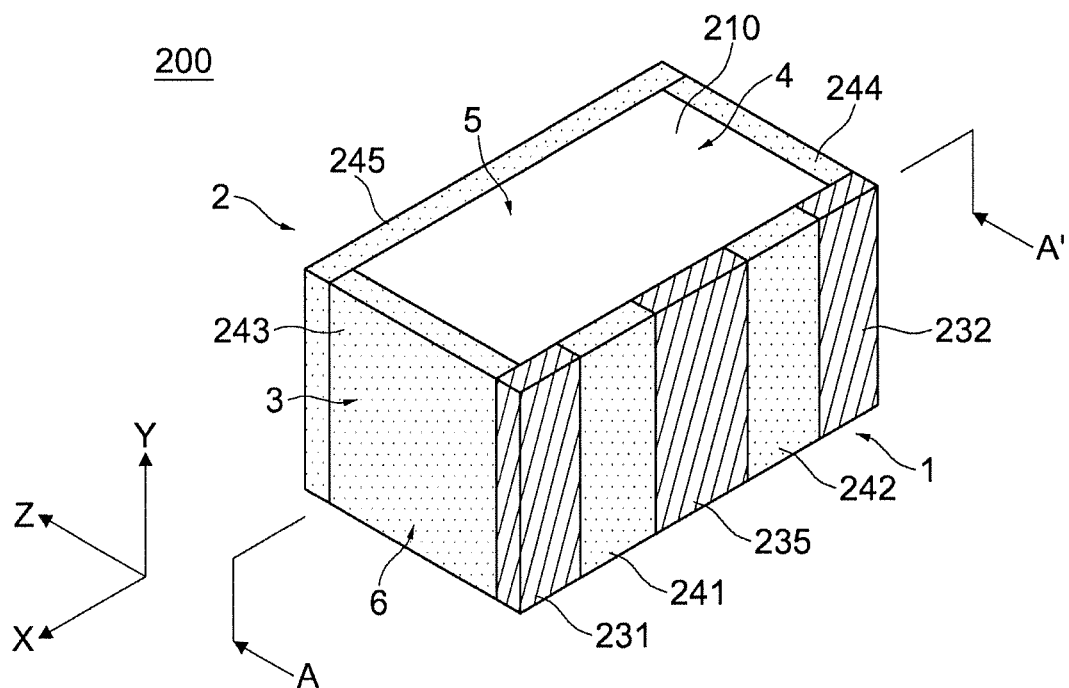
FIG. 7 is a perspective view illustrating a multilayer ceramic capacitor according to another exemplary embodiment of the present disclosure.

FIG. 7 is a perspective view illustrating a multilayer ceramic capacitor according to another exemplary embodiment of the present disclosure.

Referring to FIG. 7, the multilayer ceramic capacitor 200 according to another exemplary embodiment of the present disclosure as shown in FIG. 7 is different from the multilayer ceramic capacitor according to the foregoing exemplary embodiment of the present disclosure as shown in FIG. 4, in that only the fifth insulation layer 245 may be disposed on the second surface 2 of the ceramic body 210 in the width direction, instead of the third, fourth, and sixth external electrodes 233, 234, and 236 and the fifth and sixth insulation layers 245 and 246.

In this case, the third and fourth lead portions 221c and 221d and the sixth lead portion 222b may be exposed to the second surface 2 of the ceramic body 210 in the width direction, but may be insulated by the fifth insulation layer 245, such that a deterioration in reliability may not be caused.

Hereafter, although the present disclosure will be described in detail with reference to Examples, the present disclosure is not limited thereto.

Inventive Examples

The Inventive Examples were respectively manufactured such that the predetermined distance G by which each of the first and second lead portions of the first internal electrode of a vertical multilayer capacitor is spaced apart from the third lead portion of the second internal electrode thereof, and the ratio W1/W2 of the width W1 of the third lead portion to the width W2 of the third external electrode connected to the third lead portion, satisfied the numerical ranges according to the exemplary embodiments of present disclosure.

Comparative Examples

The Comparative Examples were respectively manufactured under the same conditions as those of the Inventive Examples, with the exception that the predetermined distance G by which each of the first and second lead portions of the first internal electrode of a vertical multilayer capacitor is spaced apart from the third lead portion of the second internal electrode, and the ratio W1/W2 of the width W1 of the third lead portion to the width W2 of the third external electrode connected to the third lead portion, were outside of the numerical ranges according to the exemplary embodiments of the present disclosure.

Table 1 below shows comparison results of reliability based on equivalent series inductance (ESL) and the occurrence number of short circuits depending on values of the predetermined distance G by which each of the first and second lead portions of the first internal electrode of the vertical multilayer capacitor is spaced apart from the third lead portion of the second internal electrode thereof, according to the exemplary embodiments of the present disclosure.

The reliability depending on the occurrence number of short-circuits was evaluated by measuring the number of short-circuits occurred with respect to 50 specimens, while the ratio W1/W2 of the width W1 of the third lead portion to the width W2 of the third external electrode connected to the third lead portion was fixed to be 1.7.

TABLE 1

| Sample | Distance G by which first and second lead portions are spaced apart from third lead portion (μm) | Equivalent Series Inductance (ELS) (pH) | The occurrence Number of Short-circuits (ea) |
|---|---|---|---|
| *1 | −200 | 19.8 | 25 |
| *2 | −100 | 20.4 | 12 |
| *3 | −50 | 20.8 | 6 |
| *4 | −20 | 21.1 | 2 |
| 5 | 0 | 22.8 | 0 |
| 6 | 20 | 23.6 | 0 |
| 7 | 50 | 24.7 | 0 |
| *8 | 75 | 28.1 | 0 |
| *9 | 100 | 32.2 | 0 |
| *10 | 150 | 40.3 | 0 |

*Comparative Examples

Referring to Table 1, in samples 1 to 4, Comparative Examples, the predetermined distance G by which each of the first and second lead portions of the first internal electrode is spaced apart from the third lead portion of the second internal electrode had a negative (−) value, which means that the lead portions of the internal electrodes are overlapped with each other.

In these cases, a large number of the occurrence of short-circuits were generated, so that it could be confirmed that reliability was defective in the cases.

Further, in samples 8 to 10, Comparative Examples, the predetermined distance G by which each of the first and second lead portions of the first internal electrode is spaced apart from the third lead portion of the second internal electrode exceeded 50 μm, such that it may be appreciated that the equivalent series inductance (ESL) was increased to cause defects.

On the other hand, in samples 5 to 7, Inventive Examples, the numerical ranges according to the exemplary embodiments of the present disclosure were satisfied, so that it may be appreciated that the equivalent series inductance (ESL) was low and short-circuits did not occur to allow for high reliability.

Table 2 below shows comparison results of reliability based on equivalent series inductance (ESL) and the occurrence number of short circuits depending on values of the ratio W1/W2 of the width W1 of the third lead portion to the width W2 of the third external electrode connected to the third lead portion, in the vertical multilayer capacitor, according to an exemplary embodiment of the present disclosure.

The reliability depending on the number of occurrence of short-circuits was evaluated by measuring the number of short-circuits occurred with respect to 50 specimens, while the values of the predetermined distance G by which each of the first and second lead portions of the first internal electrode is spaced apart from the third lead portion of the second internal electrode was fixed to be 0, 20 and 50 μm.

TABLE 2

| Sample | Distance G by which first and second lead portions are spaced apart from third lead portion (μm) | W1/W2 | Equivalent Series Inductance (ELS) (pH) | The occurrence Number of Short-Circuits (ea) |
|---|---|---|---|---|
| *11 | 0 | 0.8 | 23.1 | 4 |
| 12 | 0 | 1.0 | 22.9 | 0 |
| 13 | 0 | 1.5 | 22.8 | 0 |
| 14 | 0 | 2.0 | 22.9 | 0 |
| *15 | 0 | 2.5 | 23.2 | 1 |
| *16 | 20 | 0.8 | 24.1 | 3 |
| 17 | 20 | 1.0 | 23.8 | 0 |
| 18 | 20 | 1.5 | 23.6 | 0 |
| 19 | 20 | 2.0 | 23.7 | 0 |
| *20 | 20 | 2.5 | 23.9 | 3 |
| *21 | 50 | 0.8 | 25.3 | 1 |
| 22 | 50 | 1.0 | 24.8 | 0 |
| 23 | 50 | 1.5 | 24.6 | 0 |
| 24 | 50 | 2.0 | 24.7 | 0 |
| *25 | 50 | 2.5 | 25.4 | 5 |

*Comparative Examples

Referring to Table 2, in samples 11, 15, 16, 20, 21, and 25, Comparative Examples, the ratio W1/W2 of the width W1 of the third lead portion to the width W2 of the third external electrode connected to the third lead portion was outside of the numerical range according to the exemplary embodiments of the present disclosure, such that it can be seen that short circuits occurred to cause defective reliability, thereby increasing the equivalent series inductance (ESL).

On the other hand, in samples 12 to 14, 17 to 19, and 22 to 24, Inventive Examples, the numerical range according to the exemplary embodiments of the present disclosure were satisfied, so that it may be appreciated that the equivalent series inductance (ESL) was low and short-circuits did not occur to allow for high reliability.

Board Having Multilayer Ceramic Capacitor

Figure 8:
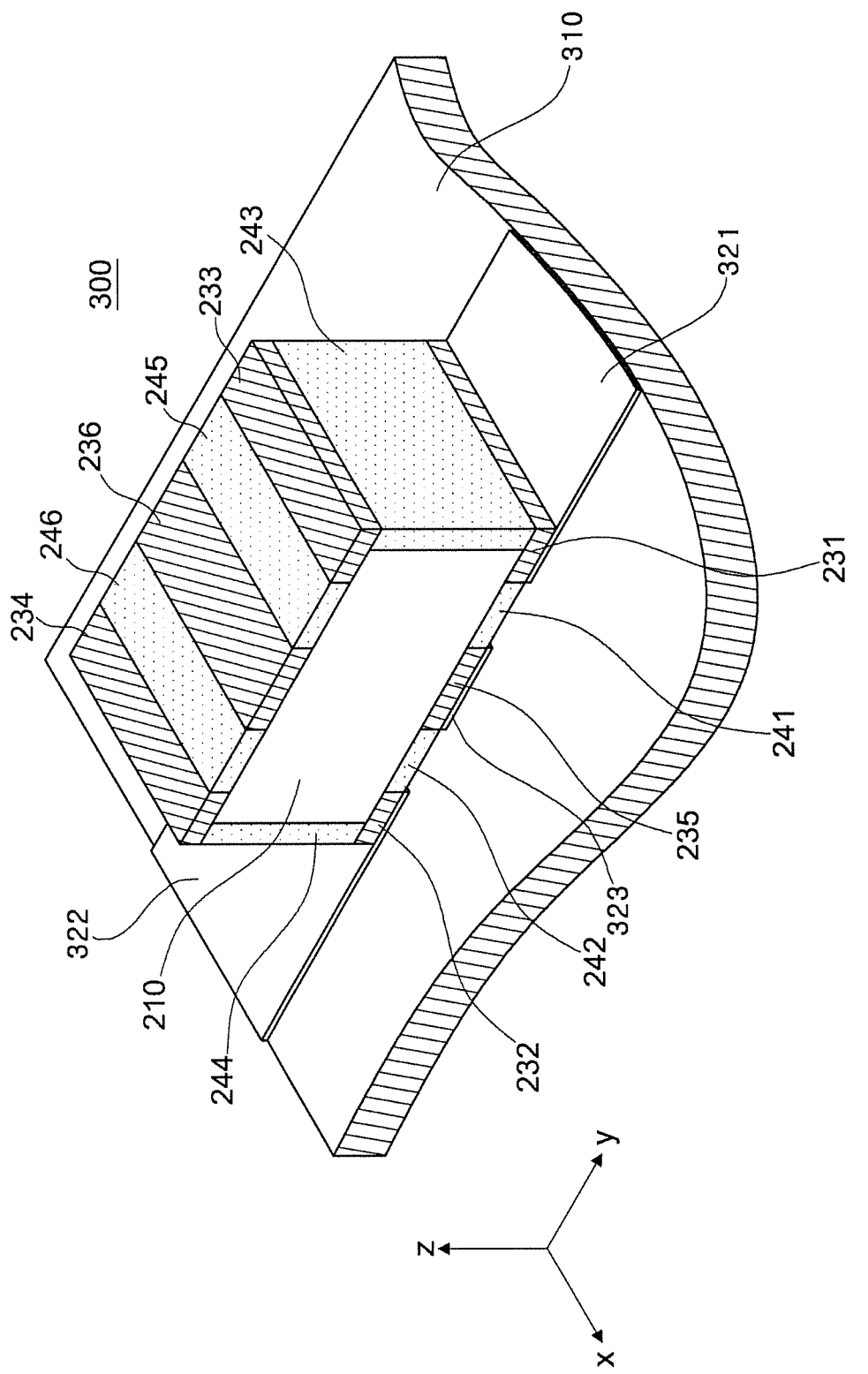
FIG. 8 is a perspective view illustrating a state in which the multilayer ceramic capacitor of FIG. 4 is mounted on a printed circuit board.

FIG. 8 is a perspective view illustrating a state in which the multilayer ceramic capacitor of FIG. 5 is mounted on a printed circuit board.

Referring to FIG. 8, a board 300 having the multilayer ceramic capacitor 200 according to an exemplary embodiment of the present disclosure may include a printed circuit board 310 on which the internal electrodes of the multilayer ceramic capacitor 200 are mounted to be perpendicular with respect to the printed circuit board 310, and first to third electrode pads 321, 322 and 323 formed on an upper surface of the printed circuit board 310 to be spaced apart from one another.

Here, the multilayer ceramic capacitor 200 may be electrically connected to the printed circuit board 310 by solder in a state in which the first, second, and fifth external electrodes 231, 232, and 235 are positioned on the first, second, and third electrode pads 321, 322, and 323, respectively, to come into contact therewith.

Except for the above description, other descriptions overlapping with those described in connection with the multilayer ceramic capacitor according to the foregoing exemplary embodiments of the present disclosure will be omitted.

As set forth above, according to exemplary embodiments of the present disclosure, an internal electrode may have as large area as possible by significantly reducing a margin part or a gap in a dielectric layer of a ceramic body. Therefore, an overlap area between the first and second internal electrodes may be increased, and thus a multilayer ceramic capacitor having high capacitance may be formed.

In addition, a distance between the first and second internal electrodes to which external polarities are applied may be decreased, such that a current loop may be shortened. Therefore, equivalent series inductance (ESL) may be reduced.

According to exemplary embodiments of the present disclosure, an insulation layer formed on the ceramic body may cover end portions and lead portions of the first and second internal electrodes exposed to surfaces of the ceramic body to prevent a short-circuit between the internal electrodes, thereby preventing internal defects such as a deterioration in moisture resistance characteristics and the like.

According to exemplary embodiments of the present disclosure, a height of the insulation layer may be adjusted, and the multilayer ceramic capacitor may be more stably mounted on the circuit board by lowering the height of the insulation layer as compared to heights of the first and second external electrodes.

According to exemplary embodiments of the present disclosure, in the multilayer ceramic capacitor, a current may flow to the internal electrodes through a plurality of external electrodes. Therefore, a magnitude of an inductance component connected to a capacitance component of the multilayer ceramic capacitor in series may be significantly reduced.

Additionally, the lead portions of the first and second internal electrodes do not overlap each other, such that the occurrence of short-circuits may be reduced, thereby allowing for excellent reliability.

While exemplary embodiments have been shown and described above, it will be apparent to those skilled in the art that modifications and variations could be made without departing from the spirit and scope of the present disclosure as defined by the appended claims.

What is claimed is:

1. A multilayer ceramic capacitor comprising:
    a ceramic body including a plurality of dielectric layers;
    first and second internal electrodes disposed in the ceramic body, the first internal electrode having first and second lead portions spaced apart from each other by a predetermined distance and exposed to a first surface of the ceramic body in a width direction, and the second internal electrode having a third lead portion spaced apart from third and fourth surfaces, that are opposite each other in a length direction and that are each connected to the first surface of the ceramic body, by respective predetermined distances and exposed to the first surface of the ceramic body in the width direction;
    first to third external electrodes disposed on the first surface of the ceramic body in the width direction to be connected to the first to third lead portions, respectively; and
    insulation layers disposed on the first surface of the ceramic body in the width direction, and on the third and fourth surfaces of the ceramic body in the length direction, wherein first and second insulation layers of the insulation layers are disposed on the first surface of the ceramic body in the width direction, and third and fourth insulation layers of the insulation layers are disposed on the third and fourth surfaces of the ceramic body in the length direction, respectively,
    wherein each of the first and second lead portions is spaced apart from the third lead portion by a predetermined distance in the length direction,
    each of the first and second internal electrodes is exposed to the third surface and the fourth surface of the ceramic body in the length direction,
    the third and fourth insulation layers of the insulation layers are disposed to cover the exposed portions of the first and second internal electrodes,
    when the predetermined distance by which each of the first and second lead portions is spaced apart in the length direction from the third lead portion is denoted as G, $0<G\leq50$ μm is satisfied, and
    when a width of the third lead portion is denoted as W1 and a width of the third external electrode connected to the third lead portion is denoted as W2, $1.0<W1/W2\leq2.0$ is satisfied.

2. The multilayer ceramic capacitor of claim 1, wherein end portions of the first and second internal electrodes are exposed to the third and fourth surfaces of the ceramic body in a length direction.

3. The multilayer ceramic capacitor of claim 1, wherein the first and second internal electrodes are disposed to be perpendicular with respect to the first surface of the ceramic body in the width direction.

4. The multilayer ceramic capacitor of claim 1, wherein the first and second external electrodes are partially connected to the first and second lead portions.

5. The multilayer ceramic capacitor of claim 1, wherein a length of the ceramic body is 1.0 mm or less.

6. A board having a multilayer ceramic capacitor, the board comprising:
    a printed circuit board having first to third electrode pads disposed thereon; and
    the multilayer ceramic capacitor of claim 1 mounted on the printed circuit board.

7. The multilayer ceramic capacitor of claim 1, wherein the first and second external electrodes each extend in the length direction over a side surface of a respective one of the third and fourth insulation layers.

8. A multilayer ceramic capacitor comprising:
    a ceramic body including a plurality of dielectric layers;
    first and second internal electrodes disposed in the ceramic body, the first internal electrode having first and second lead portions spaced apart from each other by a predetermined distance and exposed to a first surface of the ceramic body in a width direction, and the second internal electrode having a third lead portion spaced apart from third and fourth surfaces, that are opposite each other in a length direction and that are each connected to the first surface of the ceramic body, by respective predetermined distances and exposed to the first surface of the ceramic body in the width direction, and each of the first and second internal electrodes is exposed to the third and fourth surfaces of the ceramic body in the length direction;
    first to third external electrodes disposed on the first surface of the ceramic body in the width direction to be connected to the first to third lead portions, respectively; and
    insulation layers disposed on the first surface of the ceramic body in the width direction, and on the third and fourth surfaces of the ceramic body in the length direction, wherein first and second insulation layers of the insulation layers are disposed on the first surface of the ceramic body in the width direction, and third and fourth insulation layers of the insulation layers are disposed on the third and fourth surfaces of the ceramic body in the length direction to cover the exposed portions of the first and second internal electrodes, respectively,
    wherein each of the first and second lead portions is spaced apart from the third lead portion by a predetermined distance in the length direction,
    when the predetermined distance by which each of the first and second lead portions is spaced apart in the length direction from the third lead portion is denoted as G, $0<G\leq50$ μm is satisfied, and
    when a width of the third lead portion is denoted as W1 and a width of the third external electrode connected to the third lead portion is denoted as W2, $1.0<W1/W2\leq2.0$ is satisfied.

9. The multilayer ceramic capacitor of claim 8, wherein the first and second external electrodes each extend from the first surface of the ceramic body in the length direction to contact and cover a side surface of a respective one of the third and fourth insulation layers.

10. A multilayer ceramic capacitor comprising:
- a ceramic body including a plurality of dielectric layers;
- first and second internal electrodes disposed in the ceramic body, the first internal electrode having first and second lead portions spaced apart from each other by a predetermined distance and exposed to a first surface of the ceramic body in a width direction, and the second internal electrode having a third lead portion spaced apart from third and fourth surfaces, that are opposite each other in a length direction and that are each connected to the first surface of the ceramic body, by respective predetermined distances and exposed to the first surface of the ceramic body in the width direction;
- first to third external electrodes disposed on the first surface of the ceramic body in the width direction to be connected to the first to third lead portions, respectively; and
- insulation layers disposed on the first surface of the ceramic body in the width direction, and on the third and fourth surfaces of the ceramic body in the length direction, wherein first and second insulation layers of the insulation layers are disposed on the first surface of the ceramic body in the width direction, and third and fourth insulation layers of the insulation layers are disposed on the third and fourth surfaces of the ceramic body in the length direction, respectively,
- wherein each of the first and second lead portions is spaced apart from the third lead portion by a predetermined distance in the length direction,
- each of the first and second internal electrodes is exposed to the third surface and the fourth surface of the ceramic body in the length direction,
- the third and fourth insulation layers of the insulation layers are disposed to cover the exposed portions of the first and second internal electrodes, and
- the first and second external electrodes each extend in the length direction over a side surface of a respective one of the third and fourth insulation layers.

* * * * *